United States Patent [19]
Pani et al.

[11] Patent Number: 6,034,547
[45] Date of Patent: Mar. 7, 2000

[54] METHOD AND APPARATUS FOR UNIVERSAL PROGRAM CONTROLLED BUS

[75] Inventors: Peter M. Pani, Mountain View; Benjamin S. Ting, Saratoga, both of Calif.

[73] Assignee: Advantage Logic, Inc., Reno, Nev.

[21] Appl. No.: 08/708,403

[22] Filed: Sep. 4, 1996

[51] Int. Cl.[7] .............................................. H03K 19/177
[52] U.S. Cl. ............................................. 326/41; 326/38
[58] Field of Search ................................. 326/39–41, 47; 340/825.83, 825.84, 825.85, 825.86, 825.87

[56] References Cited

U.S. PATENT DOCUMENTS

| | | |
|---|---|---|
| 4,020,469 | 4/1977 | Manning . |
| 4,700,187 | 10/1987 | Furtek . |
| 4,736,333 | 4/1988 | Mead et al. . |
| 4,847,612 | 7/1989 | Kaplinsky . |
| 4,870,302 | 9/1989 | Freeman . |
| 4,918,440 | 4/1990 | Furtek . |
| 4,935,734 | 6/1990 | Austin . |
| 4,992,680 | 2/1991 | Benedetti et al. . |
| 5,144,166 | 9/1992 | Camarota et al. . |
| 5,204,556 | 4/1993 | Shankar . |
| 5,208,491 | 5/1993 | Ebeling et al. . |
| 5,221,865 | 6/1993 | Phillips et al. . |
| 5,243,238 | 9/1993 | Kean . |
| 5,260,610 | 11/1993 | Pederson et al. . |
| 5,296,759 | 3/1994 | Sutherland et al. . |
| 5,298,805 | 3/1994 | Garverick et al. . |
| 5,329,470 | 7/1994 | Sample et al. . |
| 5,396,126 | 3/1995 | Britton et al. . |
| 5,455,525 | 10/1995 | Ho et al. . |
| 5,457,410 | 10/1995 | Ting . |
| 5,469,003 | 11/1995 | Kean . |
| 5,477,067 | 12/1995 | Isomura et al. ................ 257/211 |
| 5,550,782 | 8/1996 | Cliff et al. ....................... 326/40 |
| 5,552,722 | 9/1996 | Kean . |
| 5,572,148 | 11/1996 | Lytle et al. ....................... 326/41 |
| 5,581,199 | 12/1996 | Pierce et al. . |
| 5,581,767 | 12/1996 | Katuski et al. ................. 395/800 |

FOREIGN PATENT DOCUMENTS

| | | |
|---|---|---|
| 415542 | 7/1990 | European Pat. Off. . |
| 630155 | 6/1994 | European Pat. Off. . |
| 2180382 | 9/1986 | United Kingdom . |
| 9208286 | 11/1991 | WIPO . |
| 9410754 | 11/1993 | WIPO . |
| 9504404 | 2/1995 | WIPO . |
| 9635261 | 11/1996 | WIPO . |

OTHER PUBLICATIONS

P. Wang, et al., "A High Performance FPGA With Hierarchical Interconnection Structure", Institute of Electrical and Electronics Engineers, pp. 239–242 (May 30, 1994).

Minnick, R.C., "A Survey of Microcellular Research", Journal of the Association for Computing Machinery, vol. 14, No. 2, Apr. 1967, pp. 203–241.

Shoup, R.G., "Programmable Cellular Logic Arrays", Ph.D. dissertation, Carnegie–Mellon University, Pittsburgh, PA March 1970—Partial.

Spandorfer, L.M., "Synthesis of Logic Function on an Array of Integrated Circuits", UNIVAC, Division of Sperry Rand Corporation, Blue Bell, PA Contract AF 19(628)2907, AFCRL 66–298, Project No. 4645, Task No. 464504, Nov. 30, 1965.

(List continued on next page.)

*Primary Examiner*—Jon Santamauro
*Attorney, Agent, or Firm*—Blakely, Sokoloff, Taylor & Zafman LLP

[57] ABSTRACT

The system and method of the present invention provides an innovative bus system of lines which can be programmed and to provide data, control and address information to the logic circuits interconnected by the bus system. This flexible structure and process enables a configurable system to be created to programmably connect one or more logic circuits, such as megacells. The programmability of the bus system enables the cascading of multiple megacells in an arbitrary fashion (i.e., wide, deep or both) and the sharing of common lines for system level communication.

32 Claims, 15 Drawing Sheets

OTHER PUBLICATIONS

AMTEL Corporation, "Field Programmable Gate Arrays—AT600 Series", 1993.

Robert H. Krambeck, "ORCA: A High performance, Easy to Use SRAM Based Architecture", Wescon '93 Record, pp. 310–320, Sep. 28–30, 1993.

Barry K. Britton, et al., "Optimized Reconfigurable Cell Array Architecture for High Performance Field Programmable Gate Arrays", Proceedings of the IEEE 1993 Custom Integrated Circuits Conference, May 1993, pp. 7.2.1–7.2.5.

Richard Cliff, et al., "A Dual Granularity and Globally Interconnected Architecture for a Programmable Logic Device", Proceedings of the IEEE 1993 Custom Integrated Circuits Conference, May 1993, pp. 7.3.1–7.3.5.

Dave Bursky, "Fine–Grain FPGA Architecture Uses Four Levels of Configuration Hierarchy", Electronic Design, pp. 33–34, Oct. 1, 1993.

Altera Corporation, Data Sheet, "Flex EPF81188 12,000–Gate Programmable Logic Device", Sep. 1992, Ver 1.

Motorola Product Brief, "MPA10XX Field Programmable Gate Arrays", Sep. 27, 1993.

Xilinx, "The Programmable Gate Array Data Book", 1992.

F. Zlotnick, P. Butler, W. Li, D. Tang, "A High Performance Fine–Grained Approach to SRAM Based FPGAs", Wescon '93 Record, pp. 321–326, Sep. 28–30, 1993.

Vidal, "Implement Neural Nets with Programmable Logic", IEEE 1988, pp. 1180–1190.

Liu, et al., "Design of Large Embedded CMOS PLA's for Built–In Self Test", IEEE 1988, pp. 50–53.

Buffoli, et al., "Dynamically Reconfigurable Devices used to Implement a Self–Tuning, High Performance PID Controller", IEEE 1989, pp. 107–112.

Devadas, "Boolean Decomposition of Programmable Logic Arrays", IEEE 1988, pp. 2.5.1–2.5.5.

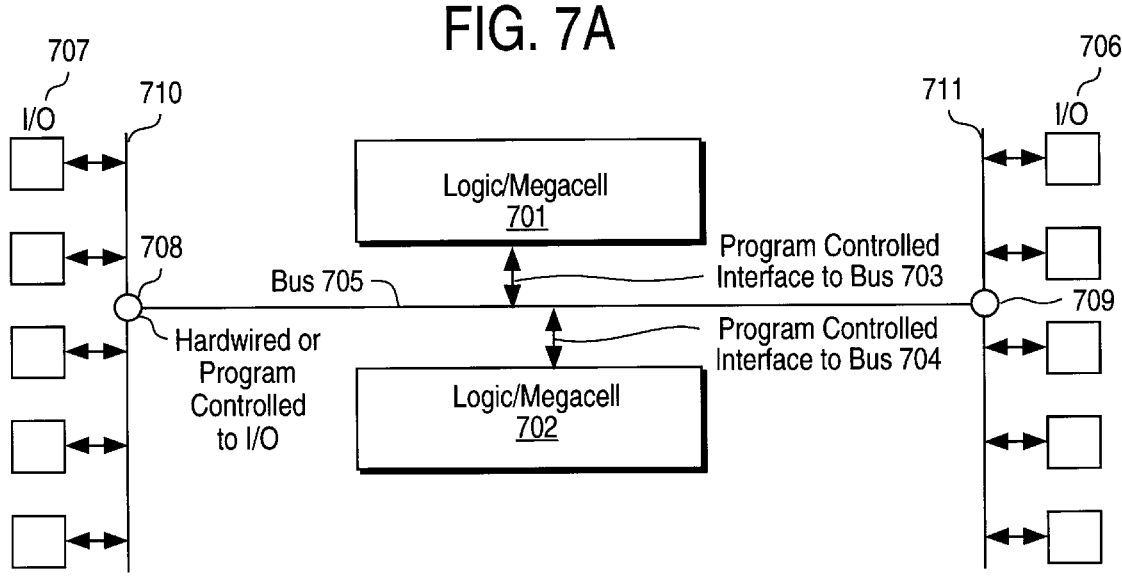

○ : Each can be bi-directional, tri-statable

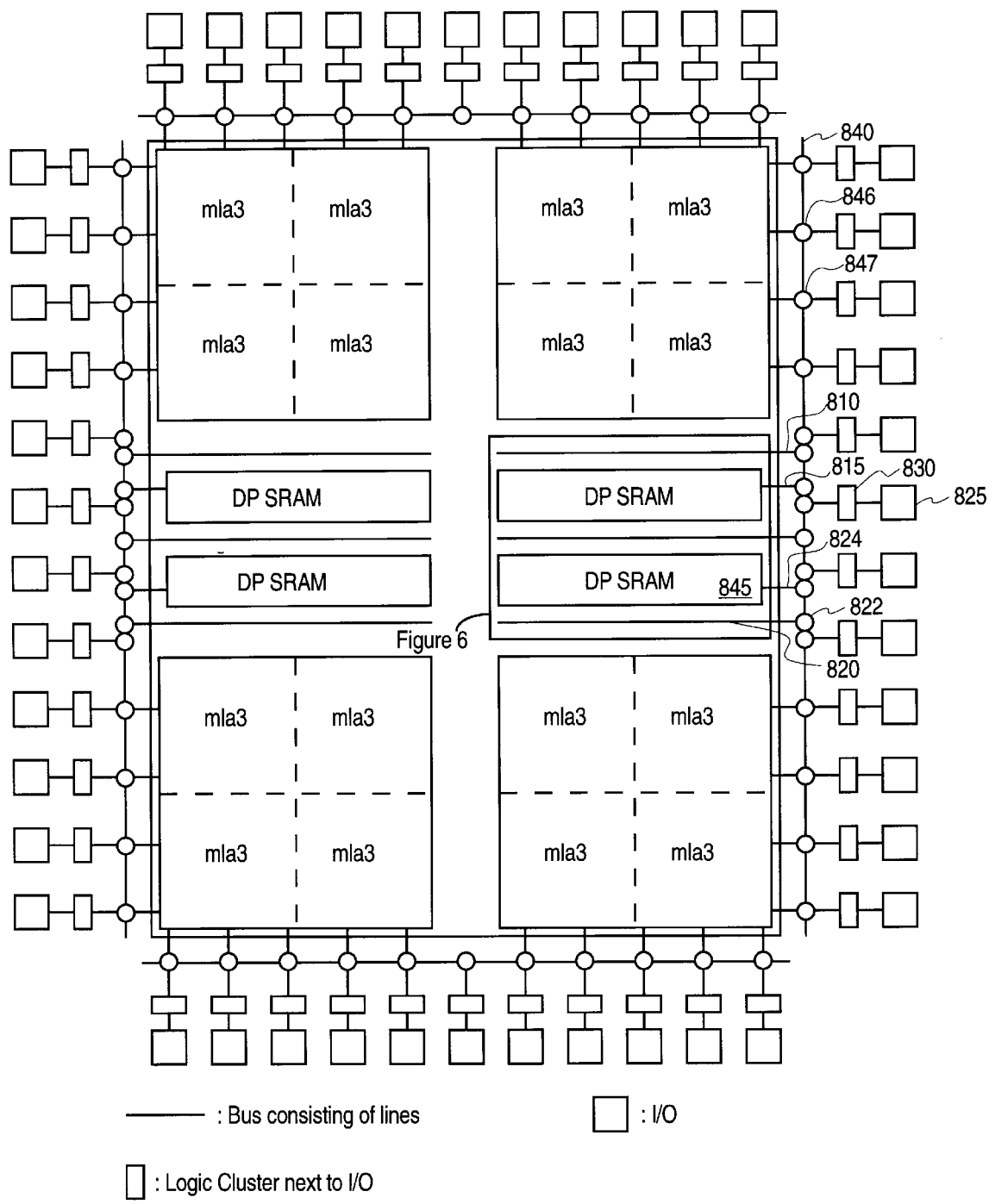

METHOD AND APPARATUS FOR UNIVERSAL PROGRAM CONTROLLED BUS

BACKGROUND OF THE INVENTION

1. Field of the Invention

The present invention is directed to a programmable, configurable bus system of lines to interconnect electrical components for an electrical/electronics system.

2. Art Background

Megacells are described as block components such as static random access memory (SRAM), microcontrollers, microprocessors and buffers. Sometimes it is desirable to interconnect a plurality of megacells together to provide a larger functional entity. One way to interconnect multiple megacells and logic circuits is through a hardwired bus system. Examples are illustrated in FIGS. 1a, 1b and 1c. FIG. 1a illustrates a bus interface to a dual port SRAM megacell. Bus lines include DATA 0–DATA15, READA0–READA9, WRITEA0–WRITEA9. To couple multiple megacells, the data lines are shared among the coupled cells. However, separate read and write lines would be required for each megacell. To the contrary, if the megacells were coupled to generate a deeper combined megacell, the data lines would be separate for each megacell and the read and write lines would be shared among the megacells. Control signals are then be used to select a particular megacell for a particular operation. This is illustrated in FIGS. 1b and 1c.

Such configurations are hardwired and cannot easily be changed to accommodate different configurations. Furthermore, if errors occur in the mask generated, repairs are not easily made, as configurability is minimal. In addition to providing a bus system to interconnect multiple megacells, tristatable input ports are sometimes used to enable multiple inputs to be input to a particular bus line thus allowing a system level communication between logic to megacells or megacells to megacells. However, a single tristate can directly couple to only one line.

SUMMARY OF THE INVENTION

The system and method of the present invention provides an innovative bus system of lines which can be programmed to provide data, control and address information to the logic circuits interconnected by the bus system in the context of an electrical/electronics system. This flexible structure and process enables a configurable system to be created to programmably connect one or more logic circuits such as megacells to external logic devices and other megacells. Thus, a system can be built using the bus structure of lines by selectively coupling the input signals and output signals from the logic circuits. The programmability of the bus system enables the cascading of multiple megacells in an arbitrary fashion (i.e., wide, deep or both) and the sharing of common lines for system level communication.

In one embodiment, a plurality of bussed lines are coupled to the data ports of megacells. A first set of programmable logic is coupled to selective lines of the system of lines and interface logic. The interface logic is coupled to input/output pads of the component for receipt of external input and output of data to be output external to the component. Individual elements of the first set of logic are programmed to selectively couple a particular interface logic element to a particular line and data port to enable the input and output of data to the megacell. It is preferred that, selective lines of the bus system of lines are each coupled to control ports of the megacell and a second set of programmable logic is coupled to the plurality of lines and interface logic elements to selectively couple a particular interface logic element to a particular line and control port to enable the selective input of control data. In another embodiment, the interface logic includes a plurality of programmable three state bi-directional input/out logic, each three state bi-directional input/output logic element coupled to the first set of programmable logic to provide further programmability to selectively couple one of the two external input or output to one of a plurality of the lines of the bus system.

In another embodiment, gateway logic is provided as coupled between the I/O pads and the processing logic. The interface logic can be configured to provide communication enhancements, such as protocols and the like, to enable sophisticated communications to and from the megacells through the bus system thus allowing a flexible scheme of a system on a chip having a bus system.

In other embodiments, programmable connections are provided between the I/O pads and the megacells and between the gateway logic and the megacells.

In addition, the programmable bus structure enables multiple megacells to be coupled together simply by programming the first set of programmable logic, second set of programmable logic and a third set of programmable logic which selectively extends the lines used to convey data, address and control information to additional megacells. This structure therefore enables additional megacells to be coupled without the prior art limitations of hardwiring connections and adding megacells in either the horizontal (width-wise) or vertical (depth-wise) orientation. Furthermore, the system allows the sharing of a common system bus for communicating among megacells.

BRIEF DESCRIPTION OF THEE DRAWINGS

The objects, features and advantages of the present invention will be apparent to one skilled in the art from the following detailed description in which.

Figure 3:
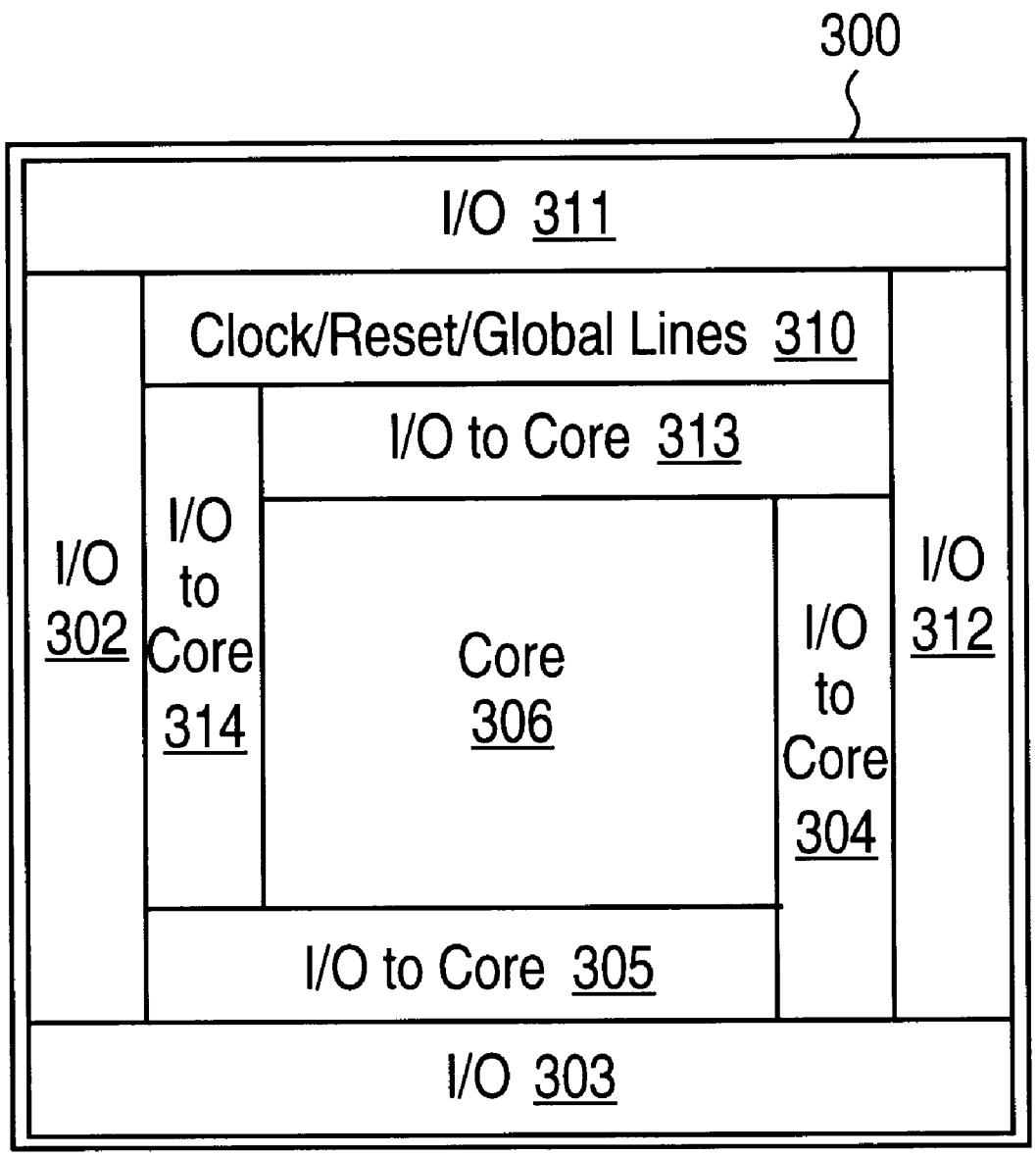
FIG. 3 is a block diagram illustration of exemplary programmable logic utilized to implement one embodiment of the configurable bus system of the present invention.
Figure 5A:
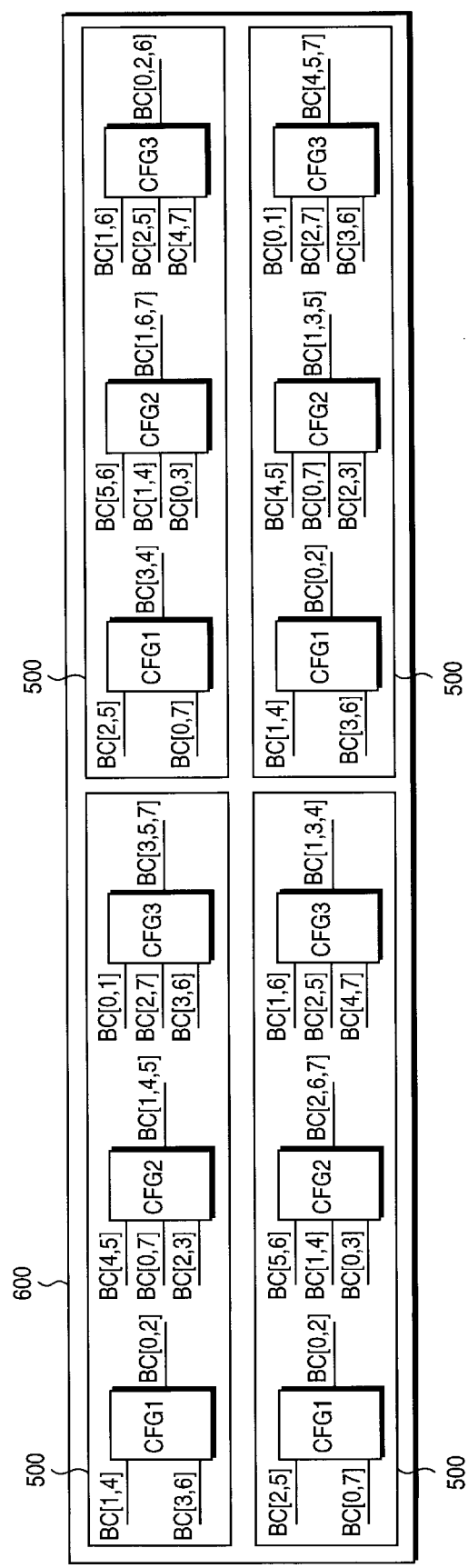
Figure 5B:
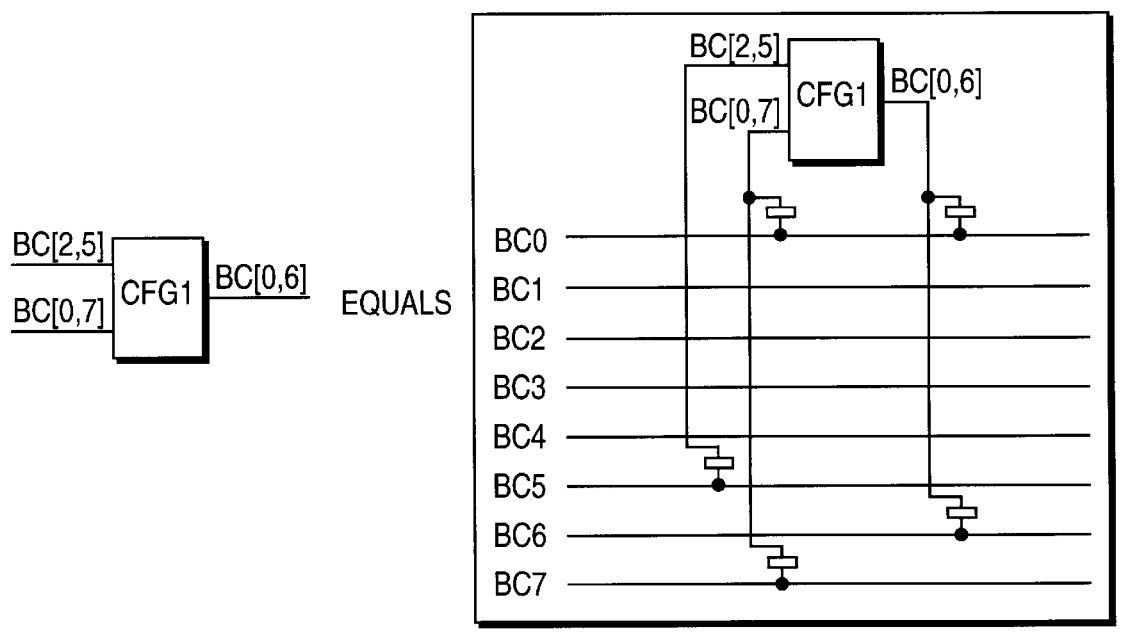

FIGS. 5A and 5B provide further illustration of the organization of the programmable logic of FIG. 3.

Figure 6:
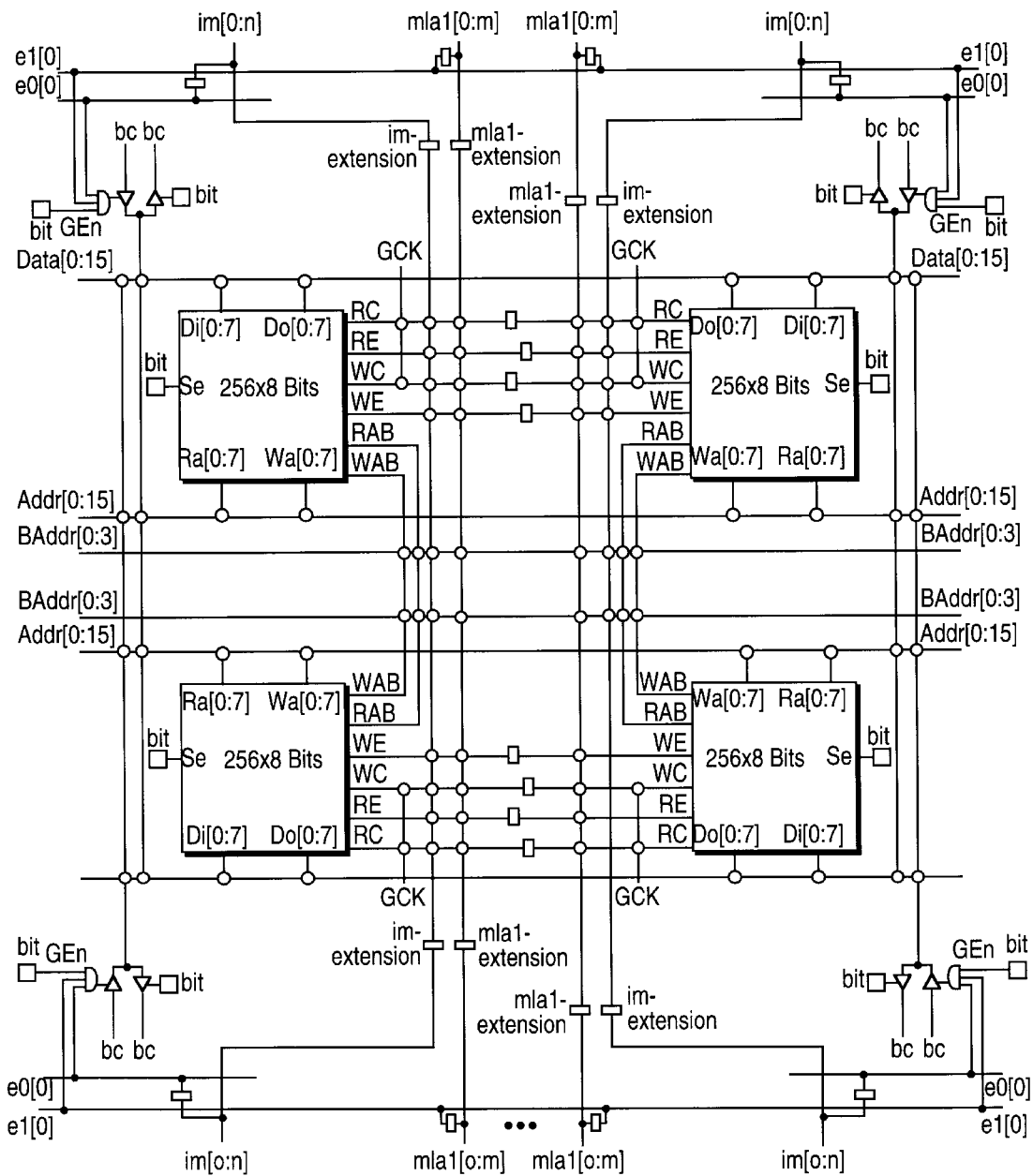

FIG. 6 illustrates the programmability of connections to bussed signal lines to multiple megacells in accordance with the teachings of the present invention.

Figure 7:
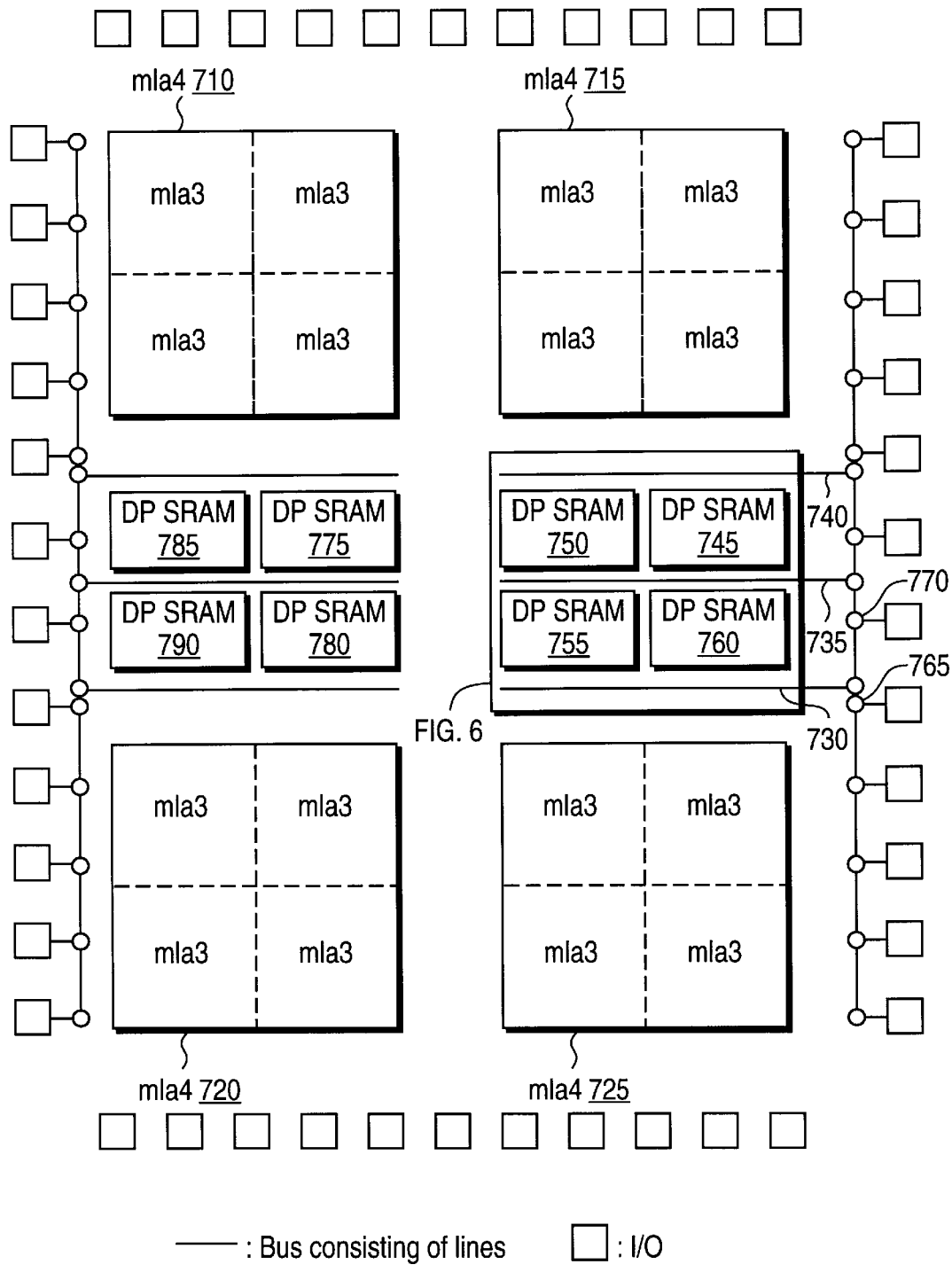

FIG. 7a is a block diagram illustration of one embodiment of a megacell connected to the bus system and I/O.

Figure 7B:
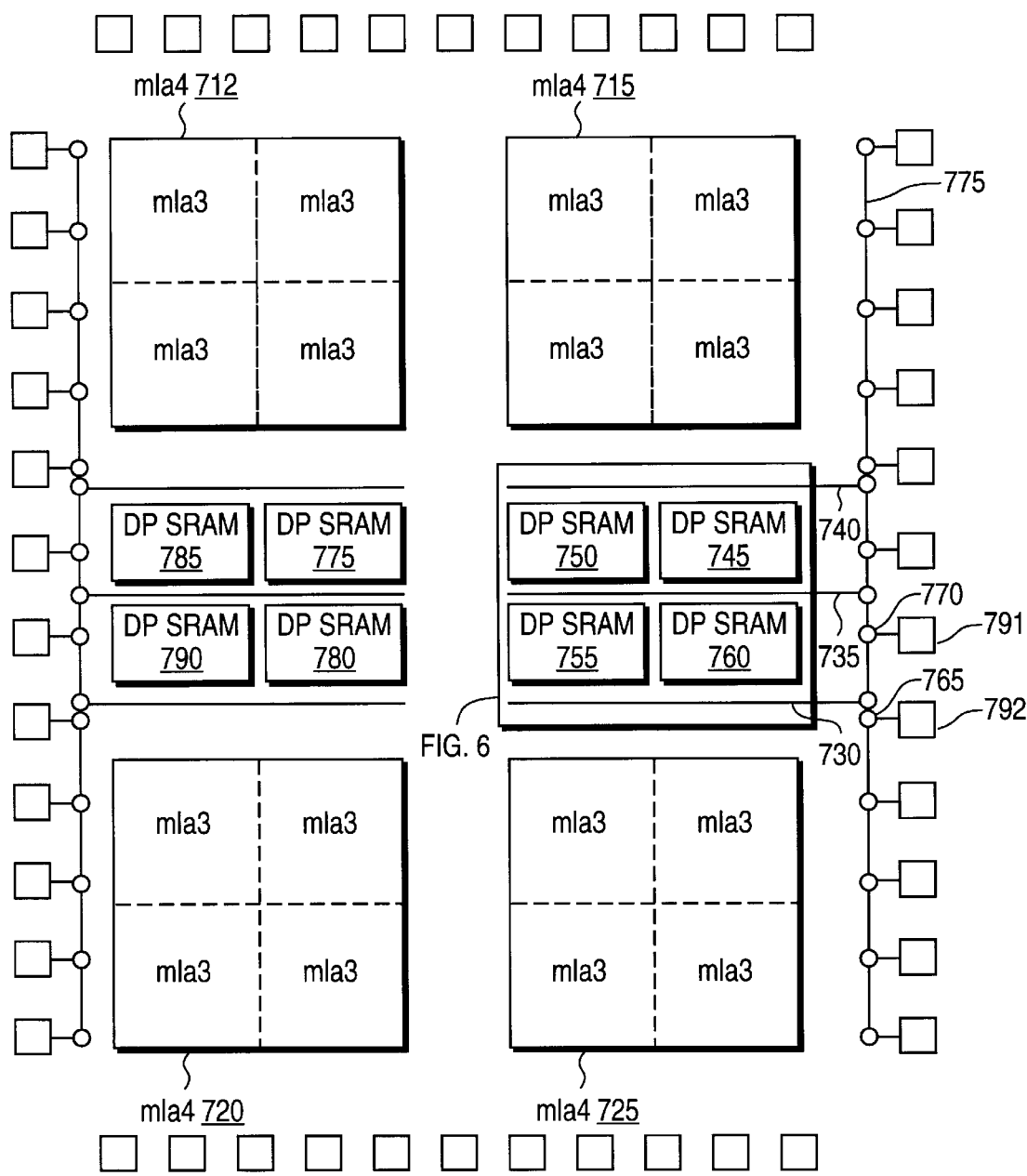

FIG. 7b illustrates one embodiment of a dual-port static random access memory (SRAM) megacell with a field programmable gate array (FPGA).

Figure 8A:
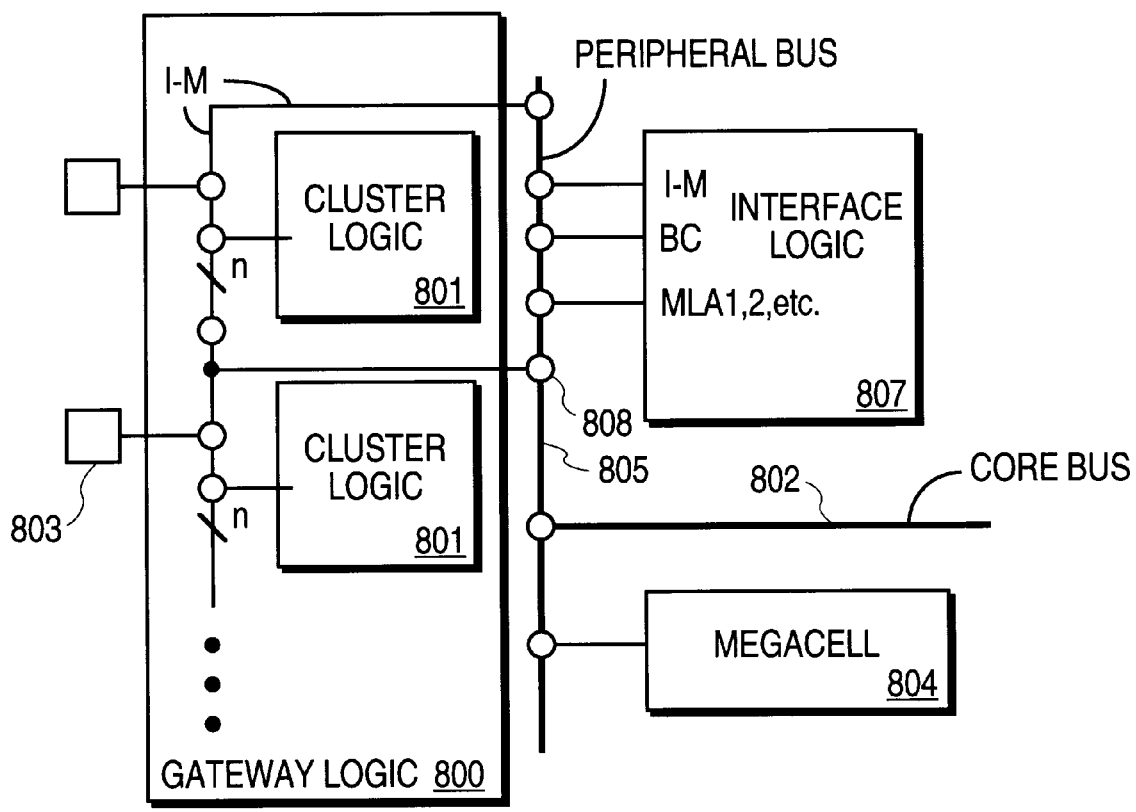

FIG. 8a is a block diagram illustration of an alternate embodiment and

FIG. 8b illustrates the embodiment incorporated into a dual port SRAM with a FPGA.

DETAILED DESCRIPTION

The system of the present invention provides a flexible programmable bus structure system of lines to couple one or more circuits for input and output as well as to each other. In the following description, for purposes of explanation, numerous details are set forth in order to provide a thorough understanding of the present invention. However, it will be apparent to one skilled in the art that these specific details are not required in order to practice the present invention. In other instances, well known electrical structures and circuits are shown in block diagram form in order not to obscure the present invention unnecessarily.

Figure 1A:
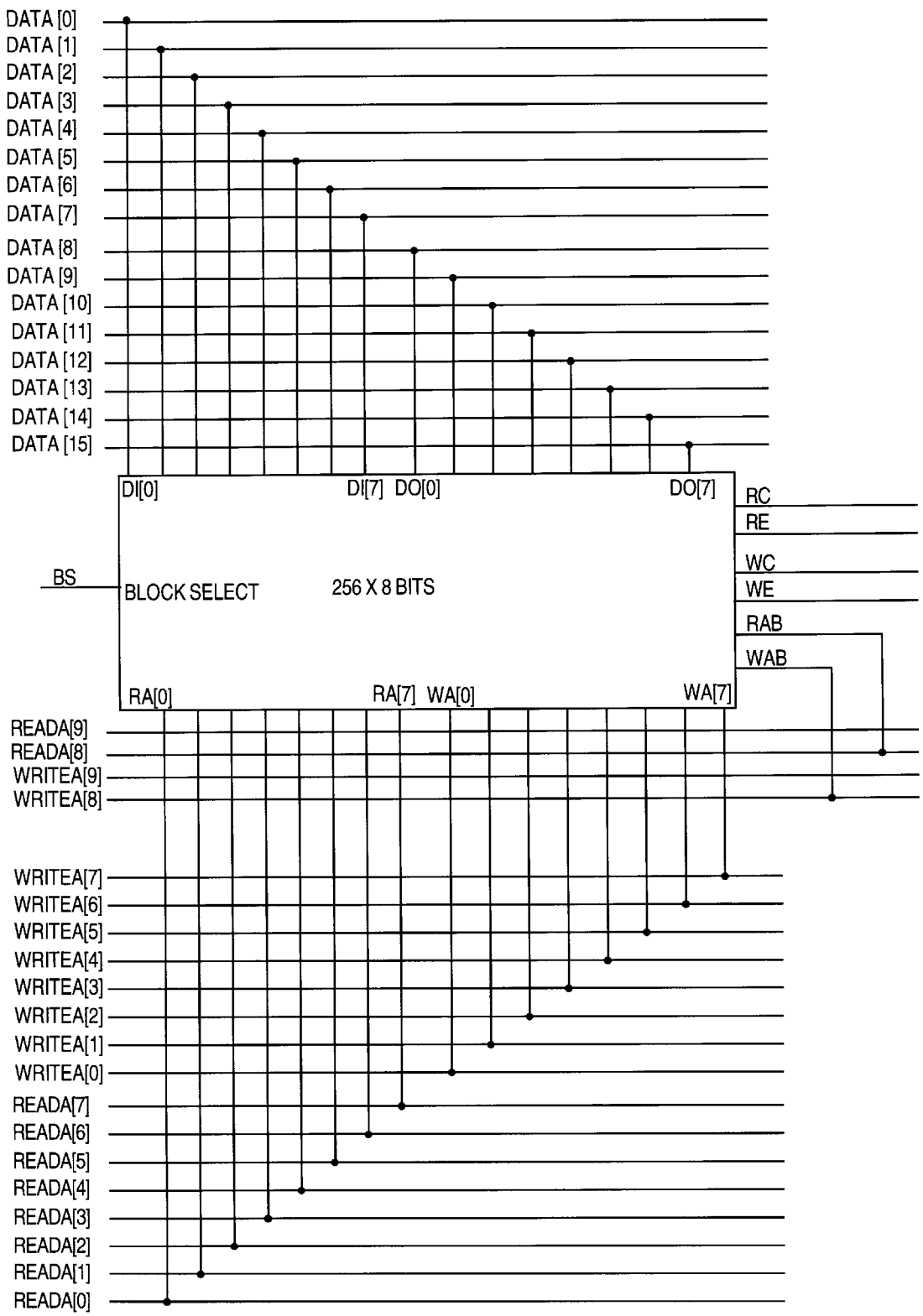
FIGS. 1a, 1b and 1c illustrate interconnections of prior art megacells.
Figure 1B:
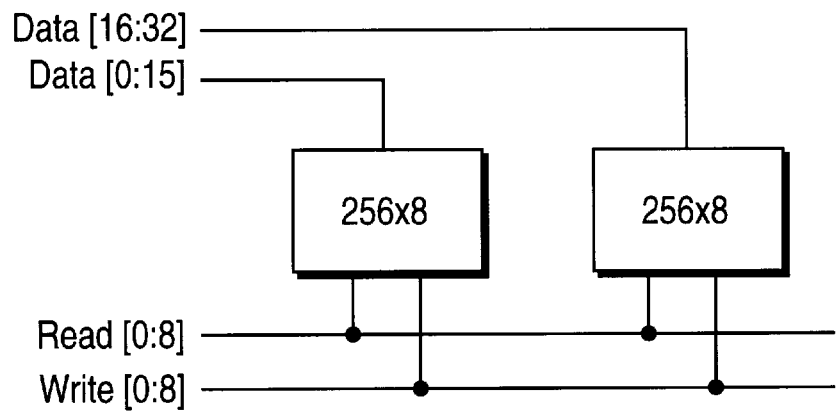
Figure 1C:
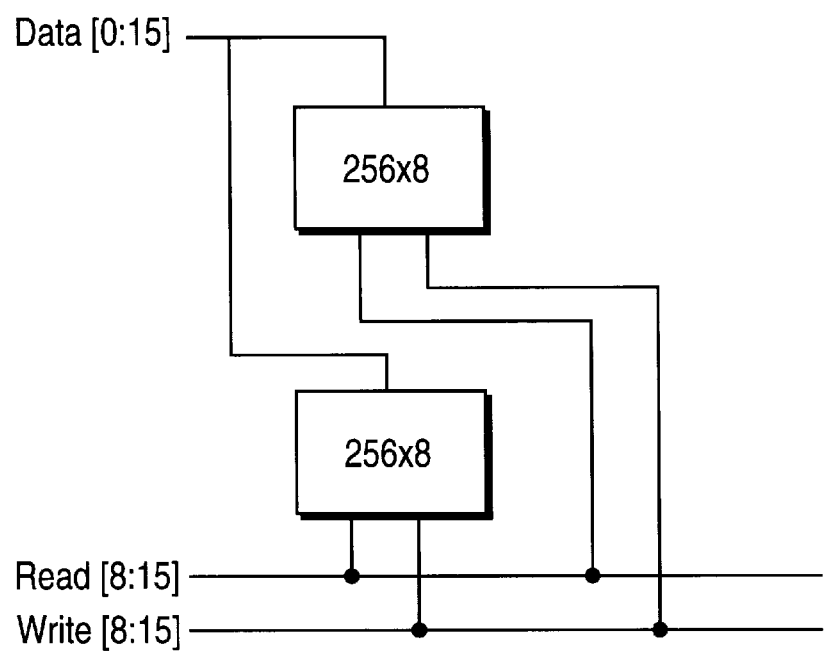
Figure 2:
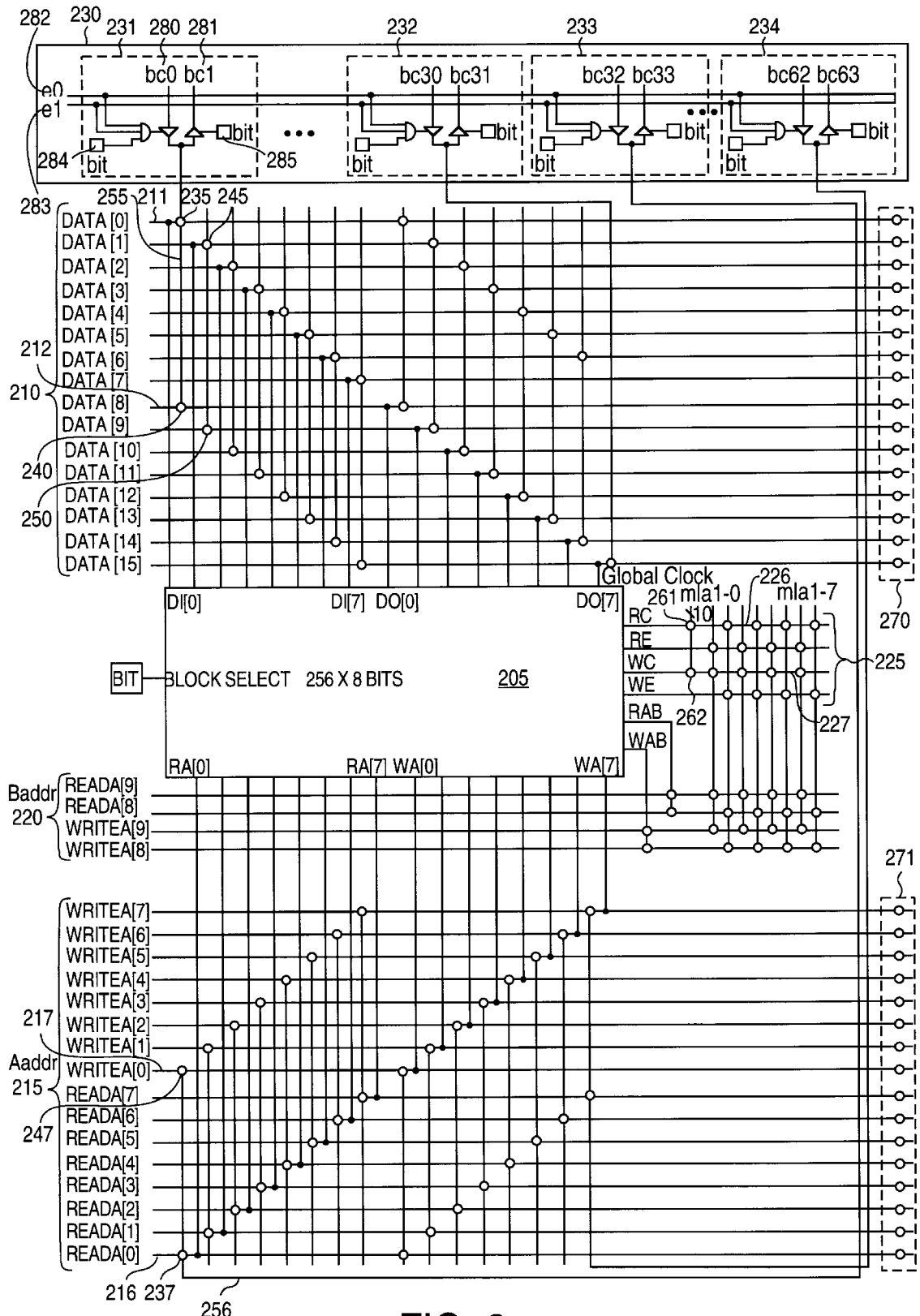
FIG. 2 illustrates one embodiment in which logic is programmably coupled to the megacell.

One embodiment of the programmable bus system is illustrated in FIG. 2. The system is illustrated using a megacell circuit; however, it is readily apparent that the system can be utilized with a variety of types of circuits and/or components. The type of megacell component used in the following discussion is a 256×8 dual port static random access memory (SRAM). However, the bus system described herein is not limited to SRAM components. A variety of components, such as microcontrollers, buffers, digital signal processors (DSPs) can be coupled to the bus system described herein.

FIG. 2 illustrates one embodiment of the configurable bus system of the present invention. Referring to FIG. 2, the configurable bus system of lines includes groups of lines 210, lines 215, and lines 220, 225. Each data input/output port of the megacell 205 is connected to one line of lines 210. For example, DI[0] is connected to Data[0], DI[1] is connected to Data[1], etc. In addition, each read or write address port of the megacell 205 is connected to one of the group of lines 215. Furthermore, lines 225 are connected to the control ports of the megacell 205. It is recognized that the exemplary system described herein has been programmed to convey address, data and control information across certain of the lines which form the bus system of lines. It is readily apparent that in other applications the system may only convey other combinations of information such as data and control. In addition, one skilled in the art recognizes that the lines are programmable and can be configured for a variety of types of information in addition to the types of information described herein.

In the present embodiment, data is preferably input to the megacell 205 and output from the megacell through interface logic 230. As will be described below, the interface logic is embodied in a programmable logic device, such as a field programmable gate array (FPGA); however, other types of logic can be used. A first set of programmable connections programmably couple the interface logic 230 to the data input/output ports of the megacell 205 (e.g., elements 235, 240, 245, 250). For example, programmable elements 235, 240 selectively connect a first line 255 from the interface logic 230 to lines Data[0]211 and Data[8]212. In addition, in the present embodiment, the programmable elements of the first set of programmable elements programmably couple the interface logic 230 to line 215. For example, programmable elements 237, 247 selectively connect a first line 256 from the input/output logic 230 to bussed lines READA[0]216 and WRITEA[0]217. Furthermore, the location of the programmable elements and the lines that each programmable element selectively connects to can be varied according to application. FIG. 2 illustrates one arrangement of programmable elements of the first set of programmable elements that provides flexibility in configuring the bus system of lines.

The control signals to the megacell 205 can be similarly transmitted over the configurable bus system described herein. A second set of programmable connections are used to selectively connect control signals received from the interface logic 230 to the lines 225 and megacell 205. For example, programmable elements 261, 262 selectively connect a global clock input to lines 226, 227. In addition, in the present embodiment, lines READA[8], READA[9], WRITEA[8], WRITEA[9](220 collectively) are used to provide the higher order address bits as control inputs to select other coupled megacells. This illustrates the capability of this innovative bus system to provide system level integration.

Preferably, a third set of programmable connections are used to selectively extend the number of megacells coupled to the configurable bus system. The bus system is configurable using elements of the third set of programmable connections to selectively connect on or more megacells to the bus system of lines. The third set of programmable connections selectively limit the load on the lines for better performance by extending the lines (and therefore increasing the load) only when needed. In the present embodiment, for example, programmable elements 270, 271 selectively extend the lines 210 and lines 215.

In addition, it is preferred that the interface logic 230 is programmable and provides bidirectional access to the bus. In addition, it is preferably that the interface logic provides three-statable control to the bus. In particular, control bits and associated logic is used to provide bidirectional, three state control and selective input/output of a plurality of external connections to the lines of the bus system. Referring to FIG. 2, the input/output logic 230 includes a plurality of elements, e.g., 231, 232, 233, 234. Each element is coupled to two external connections 280, 281. Each element is further coupled to enable control signals, e0 282, e1 283. The enable control signals e0, e1 and control bits 284, 285 function to provide the three state bus functionality that selects one of two external connections for input to or output from the bus. Control bit 284 controls the connection as input to the megacell 205 and control bit 285 controls the connection as output from the megacell 205. If the control bit 284 is set to a first state, e.g., zero, the three-state connection is disabled. If the control bit 284 is set to a second state, e.g., 1, the state of the connection is controlled by enable control signals e0, e1. Although the present embodiment incorporates the bidirectional, three state access to the bus system of lines, it is contemplated that bidirectional three state access mechanism is implemented separate from the interface logic.

The programming of the bus system of lines can be achieved a variety of ways. One method is to manually program the different programmable connections associated with particular lines of the bus system of lines. Other automated methods are also contemplated. Obviously, once programmed, the programmable connections can remain in the programmed state. Alternately, a dynamic programmable system can be provided wherein control circuitry coupled to the bus system and the programmable connections can determine, prior to a data transfer, those connections to program in order to configure the bus system of lines to transfer the data. This control circuitry could reside in a circuit coupled to the bus system for the transfer of data or in a circuit external to the bus system and connected circuits. For example, the bus system may couple a processor or arithmetic logic unit and memory. The processor or ALU can contain the control circuitry to configure the bus for each data transfer or plurality of transfers.

Furthermore, it is contemplated that the connections to be programmed can be determined a variety of ways in order to configure the bus system for a general transfer or specific transfers of data. For example, the control circuitry could examine the content of the data to be transferred and the control signals issued prior to or contemporaneous with a request to transfer or a signal indicating data is to be transferred (e.g., read or write signals or commands) to determine the programmable connections to be programmed.

The bus system described can be used to connect components, logic circuits and the like which span across one or more elements. In the present example, as noted above, the bus system is used to connect memory (SRAM) to the logic of a programmable logic device (PLD) such as a field programmable gate array (FPGA). More particularly, in the present embodiment, the bus system is used to integrate the memory into the same component as the FPGA. The FPGA, embodied as the interface logic in the present embodiment, preferably functions as control logic for accessing the SRAM or as interface logic between the SRAM and other devices. Preferably, a programmable logic device such as those described in U.S. Pat. No. 5,457,410 and U.S. patent application Ser. No. 08/534,500, filed Sep. 27, 1995 is used.

FIG. 3 is a block diagram of an exemplary FPGA 300. The I/O logic blocks 302, 303, 311, and 312 provide an interface between external package pins of the FPGA 300 and the internal user logic either directly or through the I/O to Core interface 304, 305, 313, 314. The external package pins are coupled to the lines of bus system (210, 215, FIG. 2), the signals that are processed through the input/output logic (230 FIG. 2), and the ports of the megacell (205, FIG. 2). Four interface blocks 304, 305,, 313 and 314 provide decoupling between core 306 and logic 302, 303, 311 and 312.

The Core 306 includes configurable logic and an interconnect hierarchy. In the present embodiment, the logic is organized in a number of clusters 307 of logic which are intraconnected by an I-Matrix 301 and interconnected by MLA routing network 308. The core also includes control/programming logic 309 to control the bits for programming the intraconnection and interconnection lines. In the embodiment described herein, SRAM technology is utilized. However, fuse or antifuse, EEPROM/ferroelectric or similar technology may be used. In order to minimize skewing, a separate clock/reset logic 310 is used to provide clock and reset lines on a group basis.

Figure 4A:
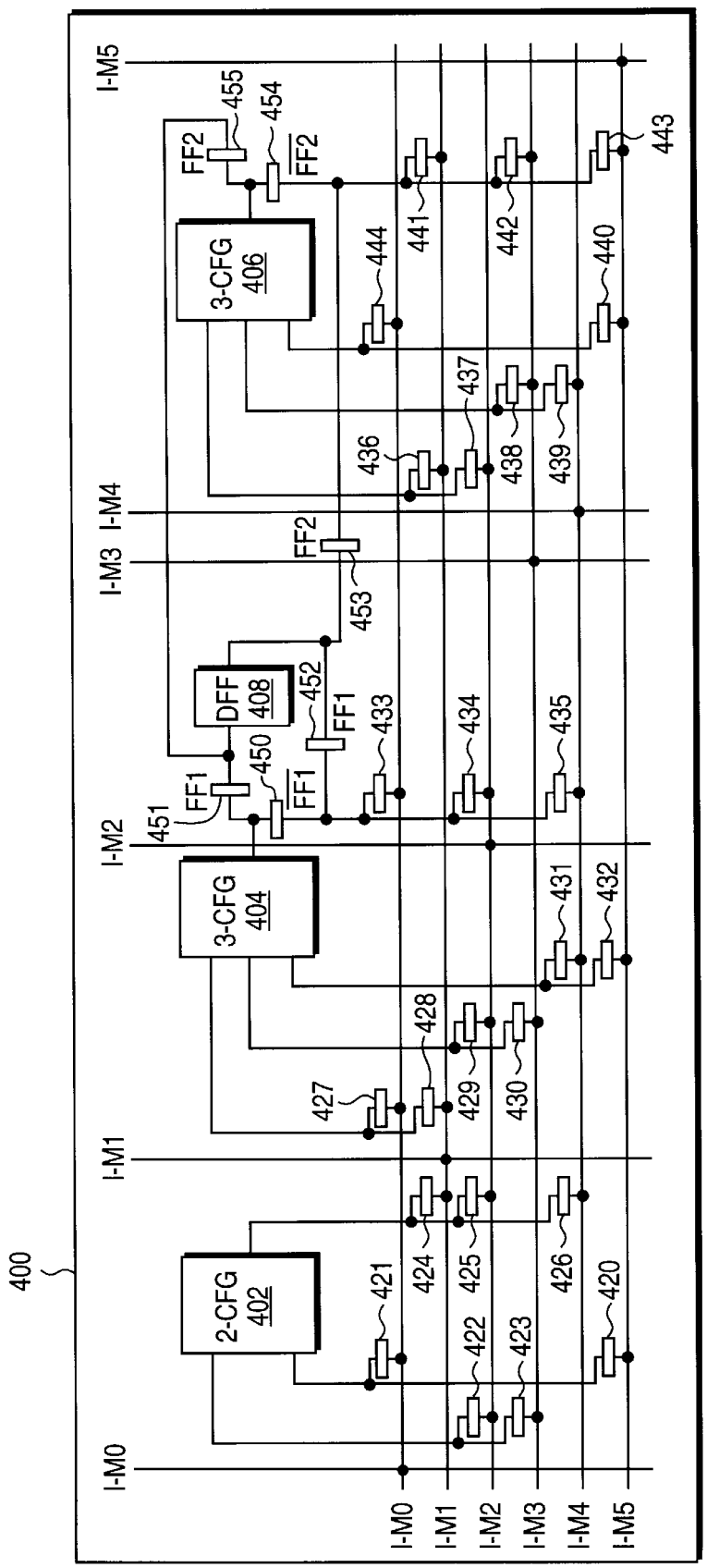
FIGS. 4A and 4B illustrate the organization of the programmable logic of FIG. 3.

The present embodiment provides logic in groups called clusters. FIG. 4a is an example of a logic cluster. It is contemplated that the logic cluster illustrated by FIG. 4a is illustrative and logic cluster can be formed of other elements such as logic gates and flip-flops. Referring to FIG. 4a, the logic cluster 400 is formed of four logic elements. These elements include one 2 input combinational logic or configurable function generator (CFG) 402, two three input CFGs 404, 406 and D flip-flop 408. CFG 402 can also be a three input CFG. The CFGs 402, 404, 406 are programmable combinatorial logic that provide a predetermined output based using two input values (for CFG 402) or three input values (for CFGs 404, 406). The CFGs are programmed with values to provide output representative of a desired logic function. The D flip flop 408 functions as a temporary storage element such as a register.

This combination of one two input, one output CFG, two three input one output CFGs and a D flip flop enable a variety of logic and arithmetic functions to be performed. For example, the elements can be programmed to perform such functions as comparator functions or accumulator functions. In the present embodiment, it is used to selectively couple bus signal lines to input/outputs of a megacell and to input/output logic. It should be noted that this combination of elements provides a fine granularity without the addition of redundant elements which add to the die size and speed of processing. Furthermore, the combination of elements also maximizes usage of elements thereby maximizing usage of die size space. The fine granularity characteristic resulting in more output points that can be tapped is a desirable characteristic as often an intermediate signal generated by a particular combination of elements is needed.

In addition, the local interconnect within the cluster is structured to enable signals to be processed with minimum delays. The cluster elements, 402, 404, 406, 408, are connected through interconnection lines I-M0 through I-M5 (referred to herein collectively as I-Matrix lines) which are oriented horizontally and vertically through the logic cluster. These intraconnections of a cluster are programmable through switches, for example switches 420–444. Intraconnections lines I-M0 to I-M5 and switches 420–444 form what is referred to herein as the I-Matrix. The I-Matrix provides connectability among the elements 402, 404, 406, 408 to at least one other element of the cluster. For example, the output of the CFG 202 can be connected to the input of CFG 404 by enabling switches 424 and 428.

To ensure minimum signal delays during processing, separate, direct connections are provided between the D flip flop 408 and the three input CFGs 404, 406. Continuing reference to FIG. 4a, switches 450–455 and connected lines provide such connections. It has been determined that the input and output of the three input CFGs 404, 406 often perform programmed functions in conjunction with the register 408. For example the three input CFGs can be utilized with the register to provide a one bit multiplexing function.

The bi-directional switches 450–455 can be programmed a variety of ways to route the signal to achieve a specific function. For example, a signal output by CFG 404 can drive D flip-flop 408 by enabling switch 451. Alternately, the signal may be driven onto the I-Matrix by enabling switch 450. Similarly, the output of CFG 406 can drive the input of the D flip-flop 408 by enabling switch 455. Other routing paths by selectively enabling switches are also possible. Furthermore, the output of the CFG 402 can drive the D flip-flop 408 by an indirect connection through the I-Matrix. Thus, extreme flexibility is achieved.

The routing of the output signal of the D flip-flop is also programmable through switches 452 and 453. By selectively enabling switches 452 or 453 and selective switches of the I-Matrix, the output signal can be routed to any one of the elements of the cluster or of other clusters. The signal output is selectively routed through the switches 433–435 adjacent to the CFG 204 or to switches 441, 442 and 443 adjacent to CFG 406. Die savings are achieved without decreasing the level of usage of elements in the device.

Figure 4B:
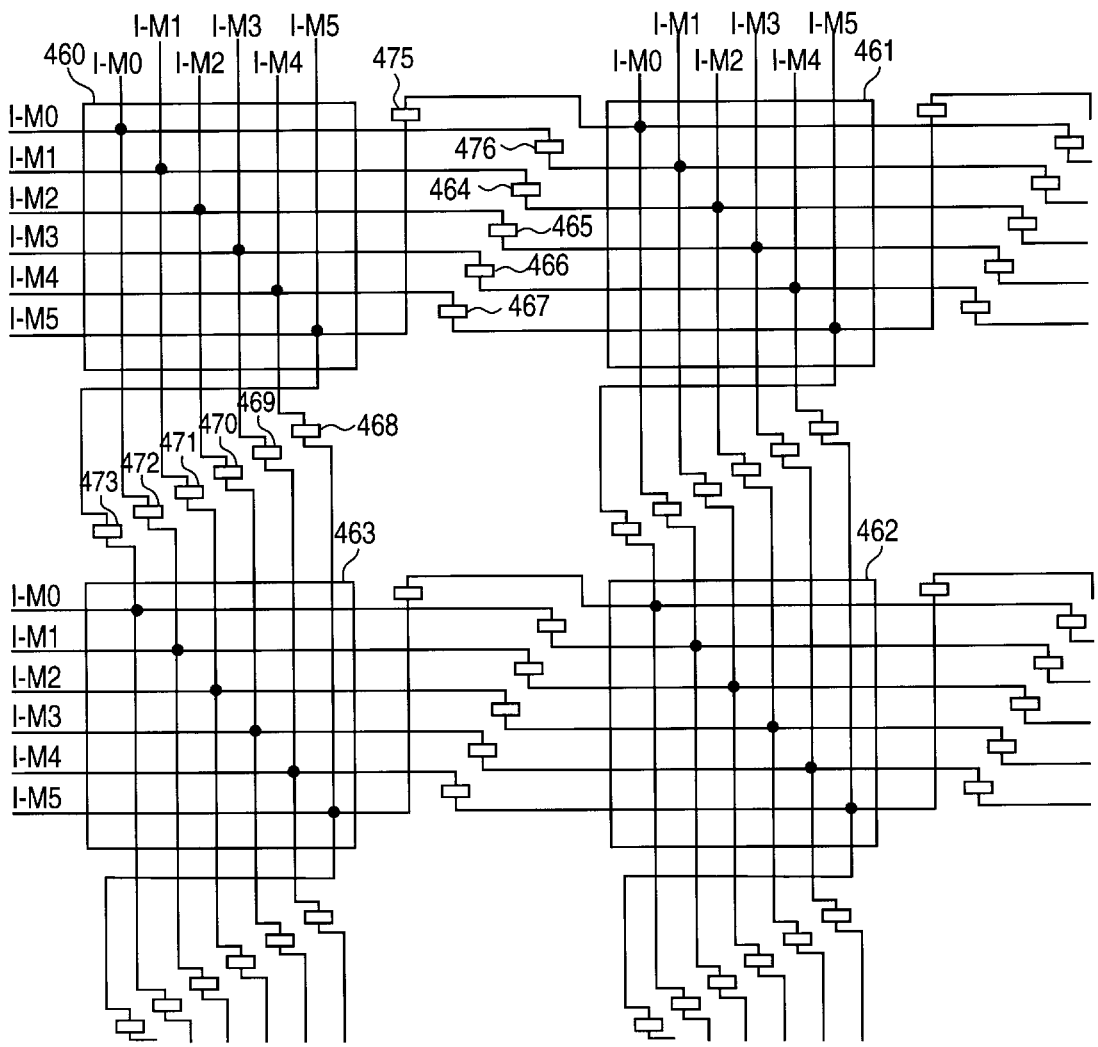

Each logic cluster is connectable to the other logic clusters inside the logic block through switches extending the I-matrix between neighboring clusters. FIG. 4b illustrates I-matrix interconnection lines I-M0 to I-M5 of a first logic cluster 460 selectively connected to the I-Matrix lines of adjacent logic clusters 461 and 463, respectively through switches 464, 465, 466, 467, 475 and 476.

The flexibility herein described is partially achieved through the numerous bi-directional switches used. It was also noted previously that the switches can be implemented a variety of ways. For example, the switches can be implemented as fusible links which are programmed by blowing the fuse to open or short the switch. Alternately, the switch can be a passgate controlled by a bit in an SRAM array. The state of the bits in the array dictate whether a corresponding passgates are open or closed.

To allow an efficient implementation of a carry chain as well as other applications, staggered or barrel connections between clusters is used to increased connectivity. FIG. 4b illustrates the extensions of the I-Matrix within a logic cluster to neighboring clusters. For example, switch 475 connects I-M5 of cluster 460 to I-M0 of cluster 461 and switch 476 connects I-M1 of cluster 460 to I-M2 of cluster 461.

A plurality of interconnected logic clusters form a logic block. In the present embodiment each logic block consists of four logic clusters organized in a 2×2 array as generally illustrated by FIG. 5a. Each logic block has a set of bidirectional routing lines to which all CFGs inside the logic clusters are programmably connected. The bi-directional routing lines provide the path for signals to travel into and out of the logic block to the routing lines of a hierarchical routing architecture having multiple lengths of interconnections at different levels of the hierarchy. It can also be seen that the block connectors can also provide connections among the CFGs of the logic clusters of the same block and adjacent blocks. Although the input and output of each element of each logic cluster of the logic block can be selectively connected to each block connector, to control the expansion on die size it is preferred that each input and output is selectively connected to a subset of block connectors. An example of such an embodiment is shown in FIG. 5b.

Referring to FIG. 5b, a symbolic representation of one embodiment of the connections to block connectors within a block 300 is shown. Each element of each cluster 500, e.g., CFG1, CFG2 and CFG3 is connected to two identified block connectors (BC) at the inputs. Two block connectors are identified as coupled to the output of the two input CFG1 and three block connectors are coupled to the output of the three input CFGs (CFG2, CFG3). The specific block connectors coupled to each elements are distributed among the elements of the block to maximize connectivity.

The block connectors provide the input and output mechanism for interconnecting to higher levels of connections of the routing hierarchy referred to as the multiple level architecture (MLA) routing network. The network consists of multiple levels of routing lines (e.g., MLA-1, MLA-2, MLA-3, MLA-4, etc.) organized in a hierarchy wherein the higher level routing lines are a multiple longer than the lower level routing lines. For example, MLA-2 routing lines are twice as long as MLA-1 routing lines and MLA-3 routing lines are twice as long as MLA-2 routing lines and MLA-4 routing lines are twice as long as MLA-3 routing lines.

Using the logic and interconnect hierarchy described, the user can program the PLD and the bus to access the memory in a variety of configurations without requiring significant space on the component.

The flexibility and utility of the configurable bus system of the present invention is illustrated with reference to FIG. 6. FIG. 6 shows the bus system configured to couple to 4 SRAM megacells arranged in a 2×2 configuration. The programmable elements are configured as passgates controlled by a bit in one of the SRAMs or other coupled memory. As is illustrated, no extra logic or interconnect is required for the bus system configuration. By enablement of the proper links which control the interconnect, the bus system is easily configured for the particular arrangement of megacells.

In the present example, the bus system is programmed to be coupled to the interconnect of the PLD (e.g., block connectors (bc), I-matrix lines (IM) and MLA lines (MLA-1)) to enable the logic of the PLD to provide the necessary interface logic to interface the SRAM to components or devices external to the system. For example, the PLD provides logic to assert the necessary control signals to transmit the address information and receive and transmit data. In the example shown in FIG. 6, data and address information is communicated through the bi-directional block connectors. Control information, including control signals to control the state of the enable signals (e0, e1) are communicated via the I-matrix and MLA-1 lines.

FIG. 7a is a block diagram illustration of one embodiment of megacell 701, 702, coupled to the bus system of the present invention. A program controlled interface 703, 704, to the bus system of lines 705 and megacells 701, 702 are provided. The interface from the core bus 705 to the I/O 706, 707 can be achieved using hardwired or program controlled connections 708, 709. Preferably, these connections are achieved using a programmable, peripheral bus system of lines 710, 711 to provide further flexibility. The peripheral bus system is preferably programmable in the same manner as described above with respect to FIG. 2. In the present embodiment, the interface logic (230 FIG. 2) provides the program controlled interface 703, 704 to the bus system 705 which is also programmed controlled.

FIG. 7b depicts an overview of an exemplary component configured with dual port SRAM megacells and a FPGA. The FPGA, including its interconnect structure, is represented by elements 712, 715, 720, 725. Each element 712, 715, 720, 725 comprises a plurality of logical blocks organized in 16×16 array with a corresponding hierarchical interconnect structure as discussed in U.S. Pat. No. 5,457, 410 and U.S. patent application Ser. No. 08/534,500. The FPGA elements 712, 715, 720, 725 are connected by the interconnect, e.g., block connectors, I-matrix lines and MLA lines (see FIG. 6), through the configurable bus system of lines (e.g., as represented by elements 730, 735, 740) to an SRAM (e.g., 745, 750, 755, 760). SRAM 745, 750, 755, 760 and elements 730, 735 and 740 correspond to the structure illustrated by FIG. 6. It should be noted that the bus system preferably spans the entire component to the adjacent array of SRAMs 775, 780, 785, 790 through programmable elements (not shown). The bus system is further coupled to I/O ports or pads (e.g., 791, 792) for input/output to/from the system to external components or devices. Although the bus system can be coupled through hardwired connections, it is preferred that the connection be made via programmable elements, e.g., 765, 770 and bus system of lines 775.

FIG. 8a is a block diagram illustration of an alternate embodiment in which gateway interface logic 801 is used to interface the core bus system 802 to the I/O 803. In addition, this diagram illustrates alternative programmable connections that can be implemented to provide further programmability and flexibility to the system.

The gateway interface logic 800 is composed of hardwired logic, metal programmable logic, or programmable logic such as a plurality of logic clusters and is directly or indirectly coupled (i.e., direct hardwired connections or indirect program controlled connections) to the megacell 804. FIG. 8a shows the gateway interface logic 800 is coupled to the megacell 804 via peripheral bus 805 which preferably includes bidirectional, three-statable connections (e.g., 808). The gateway interface logic 800 provides an additional level of logic to the interface between the megacell and the I/O pads or ports to external components or devices. The gateway interface logic can enable faster transfer of information. For example, the gateway interface logic can be structured to provide the specific bus protocols or handshaking required to interface to external devices. The gateway interface logic can also provide address decode functionality (e.g., wide decode) to expedite processing of information.

In the present embodiment, the gateway interface logic 800 is implemented as a logic cluster 801, consistent with the logic clusters referred to herein and in U.S. Pat. No. 5,457,410 and U.S. patent application Ser. No. 08/534,500. I-Matrix lines are used to connect the gateway logic to the peripheral bus 805. It should be recognized that the gateway interface logic is not limited to the specific implementation described herein and a variety of logic implementations can be used.

FIG. 8b illustrates dual port SRAMs with FPGA and the configurable bus system. In this embodiment, further programmability is provided at the I/O ports of the system using gateway interface logic. In particular, the programmable gateway logic (e.g., 830) is located between the core bus system of lines (e.g., elements 810, 815, 820) and the I/O (e.g., 825). In the present embodiment a logic cluster as illustrated in FIG. 4a is used; however, as noted above, it is contemplated that other forms of logic can be utilized. In addition, this embodiment includes a peripheral bus system of lines 840, which functions is a manner similar to the core bus system of lines, providing a programmable bus system for transferring information. Preferably, each of the programmable connections of the bus system (e.g., 846, 847) are bidirectional, three-statable connections.

Further enhancements and interconnect flexibility is achieved by providing programmable connections from the core bus (e.g., 820) direct to the peripheral bus 840 and from the megacell (e.g., 845) direct to the peripheral bus 840. For example, programmable connection 822 selectively enables the bus element 820 to be connected to peripheral bus 840. Similarly, programmable element 824 selectively connects megacell 845 directly to peripheral bus 840. Such flexibility is advantageous when speed is a consideration. For example, it may be desirable to directly connect externally received control input data to the megacell.

The invention has been described in conjunction with the preferred embodiment. It is evident that numerous alternatives, modifications, variations and uses will be apparent to those skilled in the art in light of the foregoing description.

What is claimed is:

1. A programmable bus system of lines coupled to at least one circuit and interface logic, each circuit having a plurality of data input/output ports, said bus system comprising:

a plurality of control inputs coupled to the data input/output ports, said control inputs configured to select at least two data input/output ports;

a first plurality of lines selectively coupled to at least two input/output ports of the plurality of input/output ports;

a plurality of first programming means, each first programming means coupled to a subset of the first plurality of lines, said first programming means selectively coupling at least one of the first plurality of lines of the subset, said first programming means programming the first plurality of lines to cause the selected data input/output ports to receive input data to the circuit or output data from the circuit.

2. The programmable bus system as set forth in claim 1, further comprising:

a second plurality of lines each coupled to at least one of the plurality of control inputs; and a plurality of second programming means coupling at least one of a subset of the second plurality of lines to receive control input data.

3. The programmable bus system as set forth in claim 1, wherein the plurality of first programming means are further coupled to interface logic such that output data from the circuit is processed through the interface logic and input data to circuit is received from the interface logic.

4. The programmable bus system as set forth in claim 3, wherein the interface logic comprises programmable logic devices.

5. The programmable bus system as set forth in claim 1, further comprising a plurality of bi-directional ports coupled to the plurality of first programming means to receive output data from the circuit or input data to the circuit.

6. The programmable bus system as set forth in claim 5, wherein the plurality of bi-directional ports are further coupled to interface logic such that output data from the circuit is processed through the interface logic and input data to circuit is received from the interface logic.

7. The programmable bus system as set forth in claim 5, wherein the plurality of bi-directional ports each comprise programmable three-state input-output logic.

8. The programmable bus system as set forth in claim 1, further comprising a plurality of bi-directional ports coupled to the plurality of first programming means to enable transfer of data across the first plurality of lines between a first circuit and a second circuit of the at least one circuit.

9. The programmable bus system as set forth in claim 1, further comprising sets of a plurality of third programming means, each set selectively extending the first plurality of lines from a first circuit to a second circuit.

10. The programmable bus system as set forth in claim 1, further comprising sets of a plurality of fourth programming means, each set selectively extending the second plurality of lines from a first circuit to a second circuit.

11. The programmable bus system as set forth in claim 1, further comprising:

a third plurality of lines coupled to a plurality of input/output pads of the system; and a plurality of fifth programming means, each of the plurality of fifth programming means selectively coupled between the plurality of first programming means and the third plurality of lines.

12. The programmable bus system as set forth in claim 2, further comprising:

a third plurality of lines coupled to a plurality of input/output pads of the system; and a plurality of fifth programming means, each of the plurality of fifth programming means selectively coupled between the plurality of second programming means and the third plurality of lines.

13. The programmable bus system as set forth in claim 11, further comprising gateway logic coupled between the input/output pads and the third plurality of lines.

14. The programmable bus system as set forth in claim 12, further comprising gateway logic coupled between the input/output pads and the third plurality of lines.

15. The programmable bus system as set forth in claim 1, further comprising:

a fourth plurality of lines coupled to input/output pads of the system; and a plurality of sixth programming means, each sixth programming means selectively coupling the fourth plurality of lines to input/output ports of the circuit.

16. The programmable bus system as set forth in claim 15, further comprising gateway logic coupled between the input/output pads and the fourth plurality of lines.

17. The programmable bus system as set forth in claim 3, further comprising:
   a third plurality of lines coupled to a plurality of input/output pads of the system; and
   a plurality of fifth programming means, each of the plurality of fifth programming means selectively coupled between the interface logic and the third plurality of lines.

18. The programmable bus system as set forth in claim 17, further comprising gateway logic coupled between the input/output pads and the third plurality of lines.

19. A programmable bus system of lines coupled to at least one circuit and interface logic, each circuit having a plurality of data input/output ports, said bus system comprising:
   a plurality of control inputs coupled to the data input/output ports, said control inputs configured to select at least two data input/output ports;
   a first plurality of lines selectively coupled to at least two input/output ports of the plurality of input/output ports;
   a plurality of first programming means, each first programming means coupled to a subset of the first plurality of lines;
   interface logic coupled to output data from the circuit or receive input data to the circuit, said interface logic comprising bidirectional ports coupled to the plurality of first programming means;
   each of said first programming means selectively coupling at least one of the first plurality of lines of the subset to at least one bidirectional port of the interface logic, said first programming means programming the first plurality of lines to cause the selected data input/output ports to receive input data to the circuit or output data from the circuit.

20. The programmable bus system as set forth in claim 19, further comprising gateway logic coupled between input/output pads of the system and the interface logic.

21. The programmable bus system as set forth in claim 19, further comprising:
   a second plurality of lines coupled to the input/output pads of the system; and
   a plurality of second programming means, each of the plurality of second programming means selectively coupled between the interface logic and the second plurality of lines.

22. The programmable bus system as set forth in claim 21, further comprising gateway logic coupled between the input/output pads and the second plurality of lines.

23. The programmable bus system as set forth in claim 19, further comprising a third plurality of line each coupled to at least one of the plurality of control inputs; and
   a plurality of third programming means coupling at least one of a subset of the third plurality of lines to receive control input data.

24. The programmable bus system as set forth in claim 23, further comprising:
   a fourth plurality of lines coupled to the input/output pads of the system; and
   a plurality of fourth programming means, each of the plurality of fourth programming means selectively coupled between the second plurality of lines and the fourth plurality of lines.

25. The programmable bus system as set forth in claim 19, further comprising:
   a fifth plurality of lines coupled to the input/output pads of the system; and
   a plurality of fifth programming means, each of the plurality of fifth programming means selectively coupled between the first plurality of lines and the fifth plurality of lines.

26. The programmable bus system as set forth in claim 25, further comprising gateway logic coupled between the input/output pads and the fifth plurality of lines.

27. The programmable bus system as set forth in claim 24, further comprising gateway logic coupled between the input/output pads and the fourth plurality of lines.

28. The programmable bus system as set forth in claim 19, further comprising sets of sixth programming means, each set selectively extending the first plurality of lines from a first circuit to a second circuit.

29. In an electrical system, a method for transferring data from at least one circuit or to the circuit comprising the steps of:
   configuring a plurality of control inputs to select at least two data input/output ports;
   providing a bus system of a plurality of lines and plurality of associated programming means for configuring lines of the bus system of lines to perform a transfer of data from the circuit or to the circuit;
   determining selected lines of the bus system of lines to use to perform data transfer, said step determining selected lines by reference to the content of data to be transferred and associated control signals issued; and
   programming selected programming means associated with the selected lines to configure the lines to perform the data transfer, wherein the programming causes the selected input/output ports to transfer data from the circuit or to the circuit.

30. An electrical system that enables a transfer of data from at least one circuit or to the circuit comprising:
   a plurality of control inputs configured to select at least two data input/output ports;
   a bus system of a plurality of lines;
   a plurality of associated programming means for configuring lines of the plurality of lines to transfer data;
   circuitry for determining selected lines of the plurality of lines to use to perform a data transfer from the circuit or to the circuit, said circuitry determining selected lines by reference to content of the data to be transferred and associated control signal issued, said circuitry programming selected programming means associated with the selected lines to configure the lines to perform the data transfer, wherein the programming causes the selected input/output ports to transfer data from the circuit or to the circuit.

31. The system as set forth in claim 30, wherein the circuitry is located internal to the circuit.

32. The system as set forth in claim 30, wherein the circuitry is located external to the circuit.

* * * * *

UNITED STATES PATENT AND TRADEMARK OFFICE
CERTIFICATE OF CORRECTION

Figure 9:
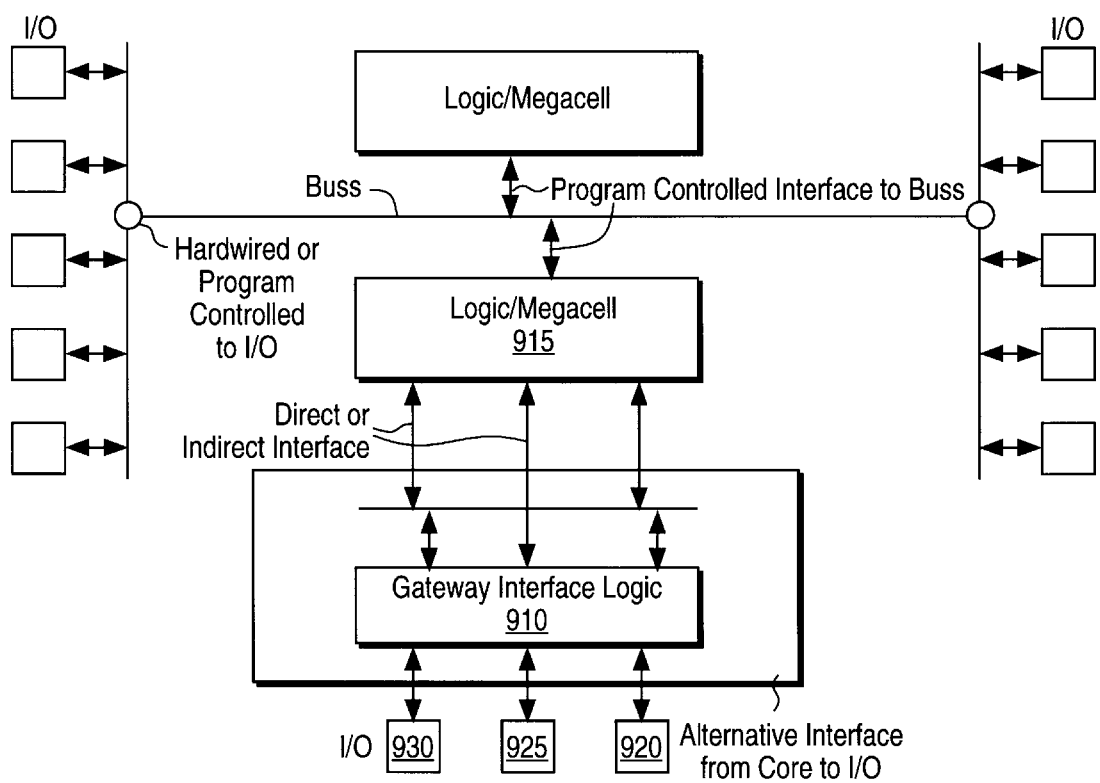

PATENT NO.     : 6,034,547
DATED          : March 7, 2000
INVENTOR(S)    : Peter M. Pani and Benjamin S. Ting It is certified that error appears in the above-identified patent and that said Letters Patent is hereby corrected as shown below:

Drawings,
Remove the following Figures:
"Fig. 7 of sheet 10 and Fig. 9 of sheet 15"

Signed and Sealed this

Twenty-fourth Day of December, 2002

JAMES E. ROGAN
*Director of the United States Patent and Trademark Office*